United States Patent
Nakamura

(10) Patent No.: US 6,252,820 B1
(45) Date of Patent: Jun. 26, 2001

(54) SEMICONDUCTOR MEMORY DEVICE CAPABLE OF MONITORING AND ADJUSTING THE TIMING AND PULSE WIDTH OF INTERNAL CONTROL SIGNALS

(75) Inventor: Kenichi Nakamura, Tokyo-To (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/633,277

(22) Filed: Aug. 4, 2000

(30) Foreign Application Priority Data

Aug. 5, 1999 (JP) .................................................. 11-222781

(51) Int. Cl.[7] ...................................................... G11C 8/18
(52) U.S. Cl. ......................... 365/233; 365/201; 365/195; 365/196; 365/189.03
(58) Field of Search ................................. 365/233, 233.5, 365/201, 194, 195, 196, 189.03

(56) References Cited

U.S. PATENT DOCUMENTS 5,208,771 * 5/1993 Shikata .................................. 365/154
5,384,735 * 1/1995 Park et al. ....................... 365/189.05
5,384,750 * 1/1995 Lee ........................................ 365/233

FOREIGN PATENT DOCUMENTS 11-213660   8/1999  (JP) .............................. G11C/11/407

* cited by examiner

Primary Examiner—Andrew Q. Tran
(74) Attorney, Agent, or Firm—Finnegan, Henderson, Farabow, Garrett & Dunner, L.L.P.

(57) ABSTRACT

A clock synchronous semiconductor memory device capable of easily certifying and estimating its characteristics comprises an SRAM for generating a word line pulse signal WLP, a writing pulse signal WP and a sense amplifier pulse signal SAP on the basis of a clock signal CLK from a control signal generating circuit 11, to control the reading/writing of data of a memory cell array. This SRAM comprises a monitor control signal (PM) input terminal 14, monitoring output buffers 12a through 12c and monitor output terminals 13a through 13c, so as to allow the monitoring of internal control signals. The SRAM further comprises a switching control signal (PCS) input terminal 16, a writing pulse control signal (WPC) input terminal 18 and a sense amplifier pulse control signal (SAPC) input terminal 20, so as to allow the control of the writing pulse signal WP and the sense amplifier pulse signal SAP from the outside. The word line pulse signal WLP can be controlled by the input of the clock signal CLK from the clock signal input terminal 22.

17 Claims, 15 Drawing Sheets

SEMICONDUCTOR MEMORY DEVICE CAPABLE OF MONITORING AND ADJUSTING THE TIMING AND PULSE WIDTH OF INTERNAL CONTROL SIGNALS

CROSS REFERENCE TO RELATED APPLICATIONS

The subject application is related to subject matter disclosed in Japanese Patent Application No. H11-222781 filed on Aug. 5, 1999 in Japan to which the subject application claims priority under Paris Convention and which is incorporated herein by reference.

BACKGROUND OF THE INVENTION

The present invention relates generally to a clock synchronous semiconductor memory device.

FIG. 10 shows the construction of a conventional clock synchronous SRAM. A memory cell array 101 has memory cells at the points of intersection between bit line pairs and word lines. A row decoder 105a and a word line driving circuit 105b are provided in order to selectively drive the word lines of the memory cell array 101. A column decoder 106 and a column gate 109 are provided in order to select the bit lines.

An address Add is incorporated into an address buffer 104 to feed a row address RA and a column address CA to the row decoder 105a and the column decoder 106, respectively. The address buffer 104 includes an address latch to control the incorporation of the address in synchronism with a clock signal CLK incorporated into a clock buffer 102. The incorporation of a chip enable signal /CE (/ denotes negative logic) and a write enable signal /WE into a command buffer 107 is also controlled by the clock signal CLK. An output enable signal /OE is not synchronous-controlled.

The clock signal CLK incorporated into the clock buffer 102 is fed to a control signal generator circuit 103 for generating various control pulse signals synchronized with the clock signal CLK. Specifically, the control signal generator circuit 103 is designed to generate a sense amplifier pulse signal SAP for activating a sense amplifier 110, a writing pulse signal WP for activating a writing circuit 111, and a word line pulse signal WLP for activating a word line driving circuit 105b.

The chip enable signal /CE and write enable signal /WE incorporated into the command buffer 107, and the output enable signal /OE transferred to the command buffer 107 are logically synthesized in a command decoder 108 to generate a sense amplifier control signal SAC, which is associated with the sense amplifier pulse signal SAP for activating the sense amplifier circuit 110, a writing circuit control signal WCC, which is associated with the writing pulse signal WP for activating the writing circuit 111, and an output buffer control signal OBC for activating a reading data buffer 112. Data incorporated into a written data buffer 113 are supplied to the memory cell array via the writing circuit 111 which is activated by the writing pulse signal WP and the writing circuit control signal WCC.

FIGS. 11A and 11B are timing charts for explaining the operation of the clock synchronous SRAM of FIG. 10, and each of these figures shows a write cycle and a subsequent read cycle.

In the above described clock synchronous SRAM, it is required to optimally set the timing and pulse width of an internal control signal which is generated by the control signal generator circuit 103. Specifically, the setting of the timing and pulse width of the internal control signal is as follows.

(a-1) In order to prevent an erroneous word line from being selected, it is required to set the timing of the generation of the word line pulse signal WLP after the output signal of the row decoder 105a is decided as shown in FIGS. 11A and 11B. However, if this timing is set late, the subsequent operation is delayed to lower the circuit operating speed.

(a-2) The pulse width of the word line pulse signal WLP determines a period of time, in which a word line is activated. The time required to activate the word line must be the time required to transfer memory cell data at a sufficient amplitude from a bit line to the sense amplifier 110 via a data line. However, if this time is too long, the electric current consumption of the memory cell increases.

(b-1) In order to prevent data from being written in a bit line of an erroneous column, it is required to set the timing of the generation of the writing pulse signal WP after the output signal of the column decoder 106 is decided as shown in FIG. 11A. However, if this timing is set late, the subsequent operation is delayed to lower the circuit operating speed.

(b-2) The pulse width of the writing pulse signal WP determines the time required to activate the writing circuit 111. The time required to activate the writing circuit 111 must be the time required to sufficiently transfer written data to the data line and bit line to invert the memory cell data. However, if this time is too long, the starting of the subsequent pre-charging of the bit line is delayed. As a result, if the operating frequency is high, written data also remain in the bit line during the next reading operation to have a bad influence on the data reading operation.

(c) It is required to set the timing of the generation of the sense amplifier pulse signal SAP so as to activate the sense amplifier 110 after the amplitude of data transferred to a data line sufficiently increases. If this timing is too early, there is a possibility that the sense amplifier 110 malfunctions, and if the timing is too late, the reading operating speed is lowered.

It is difficult to carry out the above described setting of the timing and pulse width of the internal control signal, since the influence of the parasitic capacity and parasitic resistance of signal lines increases with the scale down of patterns and the increase of memory capacities. In order to carry out the optimum setting, it is required to prepare a plurality of trial products having different numbers of stages of inverter chains for setting the timing to estimate the characteristics of these trial products. It is very expensive and takes a lot of time to estimate the trial products, so that the cost of producing the memory is high.

In addition, in order to surely prevent the malfunction of the circuit, it is required to set the timing and so forth at the sacrifice of the operating speed and electric current consumption. However, it is not conventionally possible to confirm whether excessive sacrifices are made for the operating speed and electric current consumption.

There is another problem in that the certification and estimation of the circuit operation can not be carried out by means of an inexpensive tester having a low operating frequency when the operating frequency of the memory becomes high. If the certification and estimation can not carried out unless an expensive tester operating at a high speed is used, the cost of producing the memory is high.

Specifically, FIGS. 12(a) and 12(b) show principal parts extracted from the operating timing charts shown in FIGS. 11A and 11B, when the operating frequencies are low and high, respectively.

When the word line pulse signal WLP and the write pulse signal WP fall to complete writing into a memory cell, a bit line pair is charged to VCC by means of a pre-charging circuit. However, the written data on the bit line have a much lower potential on the "L" side than the read data, so that it takes a lot of time to charge to VCC.

In the case of FIG. 12A, since the cycle time is long, the written data on the bit line does not exist when the word line is activated in the subsequent read cycle, so that the sense amplifier pulse signal SAP is generated after the bit line pair is sufficiently pre-charged to VCC and read data sufficiently appears on the bit line. In this case, the data reading operation using the sense amplifier circuit is not disturbed by the written data in the last cycle.

However, if the cycle time is shortened as shown in FIG. 12B, the time assigned to pre-charge the bit line is shortened, so that the sense amplifier pulse signal SAP is generated before the bit line is sufficiently charged to VCC. Therefore, when the read data in the read cycle is opposite to the last written data, since the read data does not sufficiently appear on the bit line, it is not possible to carry out a normal data reading operation, so that there is a possibility that malfunction is caused. It is conventionally impossible to carry out such certification and estimation of a high speed operation unless a high speed tester is used.

SUMMARY OF THE INVENTION

It is therefore an object of the present invention to eliminate the aforementioned problems and to provide a clock synchronous semiconductor memory device capable of easily certifying and estimating its characteristics.

According to the one aspect of the present invention, there is provided a semiconductor memory device comprising:

a memory cell array;

a control signal generating circuit for generating at least first through third control signals on the basis of an edge of a clock signal, said control signals having adjustable predetermined active intervals;

a word line driving circuit for driving a word line of said memory cell array in synchronism with said first control signal which is generated from said control signal generating circuit;

a sense amplifier circuit for reading bit line data of said memory cell array in synchronism with said second control signal which is generated from said control signal generating circuit;

a writing circuit for writing data in said memory cell array in synchronism with said third control signal which is generated from said control signal generating circuit; and monitor circuit for monitoring at least one of said first through third control signal, which are generated from said control signal generating circuit.

According to the present invention, monitor means is provided for monitoring the timing and pulse width of internal control signals generated on the basis of a clock signal, so that it is possible to easily certify and estimate a memory internal circuit. Specifically, according to the present invention, there are provided a first operation mode (a usual operation mode) for reading/writing data using first through third control signals generated from a control signal generator circuit, and a second operation mode (a test operation mode) for activating the monitor means to output at least one of the first through third control signals, so that it is possible to certify and estimate the memory internal circuit.

According to another aspect of the present invention, there is provided a semiconductor memory device comprising:

a memory cell array;

a control signal generating circuit for generating at least first through third control signal on the basis of a clock signal, said control signals having adjustable predetermined active intervals;

a word line driving circuit for driving a word line of said memory cell array in synchronism with said first control signal which is generated from said control signal generating circuit;

a sense amplifier circuit for reading bit line data of said memory cell array in synchronism with said second control signal which is generated from said control signal generating circuit;

a writing circuit for writing data in said memory cell array in synchronism with said third control signal which is generated from said control signal generating circuit; and control signal switching circuit for generating a pulse signal based on an external control signal, from said control signal generating circuit in place of at least one of said first through third control signals which are generated from said control signal generating circuit.

According to the present invention, various certifying operations with respect to various timings and pulse widths can be carried out by using an external control signal, in place of a control signal internally generated in synchronism with the clock signal.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of the present invention will be described below.

Figure 1:
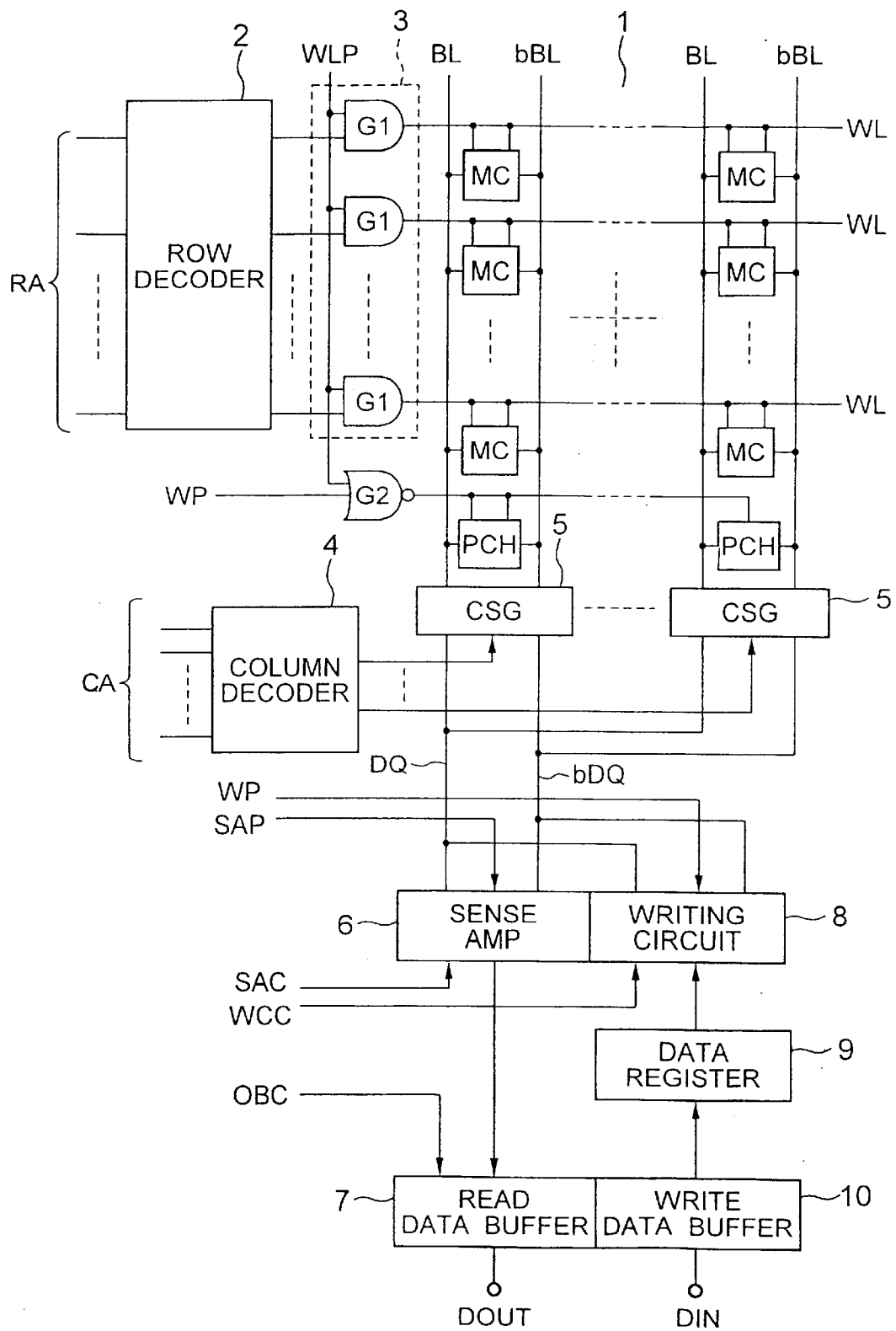
FIG. 1 is a block diagram showing a preferred embodiment of a cell array of an SRAM according to the present invention, and its peripheral constructions.
Figure 2:
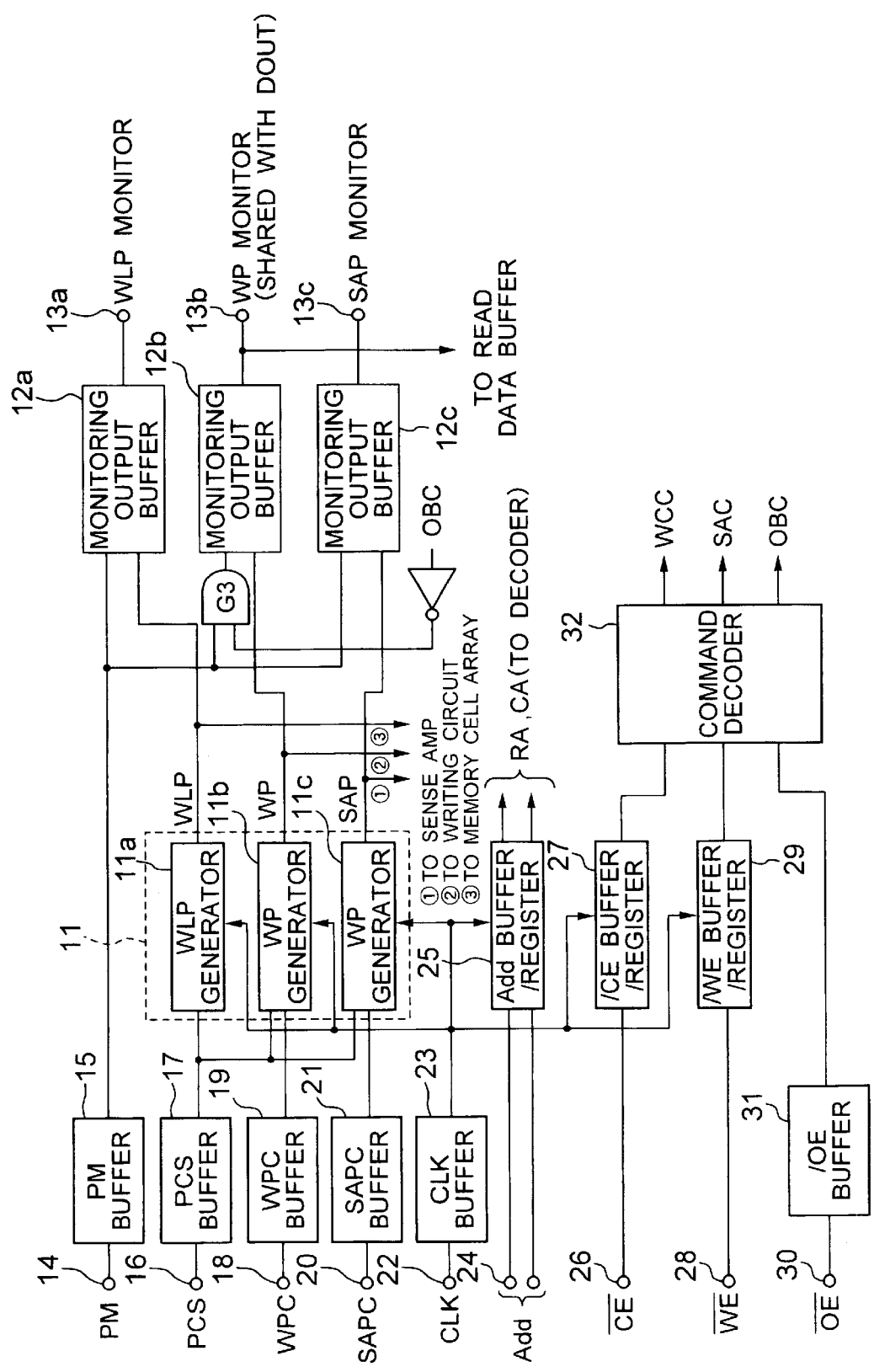
FIG. 2 is a block diagram showing the constructions of further peripheral circuits in the preferred embodiment.

FIG. 1 shows a memory cell array 1 of a preferred embodiment of a clock synchronous SRAM according to the present invention, and its peripheral circuit construction. FIG. 2 shows the constructions of circuits arranged around the circuit of FIG. 1.

The memory cell array 1 comprises a plurality of pairs of bit lines BL and bBL (b denotes bar, i.e. it has negative logic), a plurality of word lines WL, and a plurality of static memory cells MC arranged at the points of intersection therebetween. In order to selectively drive the word lines WL of the memory cell array 1, a row decoder 2 and a word line driving circuit 3 are provided. The row decoder 2 is designed to decode a row address RA to select one of the word lines WL. The word line driving circuit 3 comprises AND gates G1, each of which is activated by a word line pulse signal WLP, which is produced in synchronism with a clock signal, to transfer a decode output to a corresponding one of the word lines WL.

The pair of bit lines BL and bBL of the memory cell array 1 are selected by a column decoder 4 and a column gate (CSG) 5 controlled by its decode output. The column decoder 4 is designed to decode a column address CA to select one column, and the column gate 5 is selectively turned on by the decode output of the column decoder 4, so that the pair of bit lines BL and bBL are connected to a pair of data lines DQ and bDQ.

The pair of data lines DQ and bDQ are provided with a sense amplifier circuit 6 for reading bit line data, and a writing circuit 8 for transferring written data to the pair of bit lines BL and bBL. The sense amplifier circuit 6 is activated by a conjunction of a sense amplifier pulse signal SAP, which is generated in synchronism with a clock signal CLK, and a sense amplifier control signal SAC which is generated in a data reading mode on the basis of a command. The writing circuit 8 is activated by a conjunction of a writing pulse signal WP, which is generated in synchronism with the clock signal CLK, and a write control signal WCC which is generated in a data writing mode on the basis of a command.

Read data by one sense amplifier circuit 6 are taken out by a data output terminal DOUT via a reading data buffer 7 which is activated by an output buffer control signal OBC generated on the basis of a command. Written data are transferred from a data input terminal DIN to a data register 9 via a written data buffer 10 to be held therein, and transferred from the data register 9 to the writing circuit 8.

Each of the pairs of bit lines BL and bBL of the memory cell array 1 is provided with a bit line pre-charging circuit PCH. This bit line pre-charging circuit PCH is controlled by a NOR gate G2, to which the writing pulse signal WP and the word line pulse signal WLP are inputted. That is, the NOR gate G2 outputs an "H" output when both of the word line pulse signal WLP and the writing pulse signal WP are in "L", so that the bit line pre-charging circuit PCH is inactivated.

In order to generate the word line pulse signal WLP, the writing pulse signal WP and the sense amplifier pulse signal SAP which are internal control signals, a control signal generator circuit 11 is provided as shown in FIG. 2. The control signal generator circuit 11 comprises a word line pulse signal (WLP) generator circuit 11a, a writing pulse signal (WP) generator circuit 11b and a sense amplifier pulse signal (SAP) generator circuit 11c, which generate a word line pulse signal WLP, a writing pulse signal WP and a sense amplifier pulse signal SAP, respectively, the timing and pulse width of each of which has been determined, on the basis of a clock signal incorporated into a clock buffer 23 via a clock signal input terminal 22.

In this preferred embodiment, in order to allow adjusting of the timing and pulsewidth of each of the internal control signals, which are generated from the control signal generator circuit 11, to be switched from the outside, there are provided a PSC input terminal 16 for inputting a switching control signal PSC, a WPC input terminal 18 for inputting a writing pulse control signal WPC, and an SAPC input terminal 20 for inputting a sense amplifier pulse control signal SAPC. The switching control signal PCS, the writing pulse control signal WPC and the sense amplifier control signal SAPC are incorporated into buffers 17, 19 and 21, respectively, to be supplied to the control signal generator circuit 11.

As will be described in detail later, when the switching control signal PCS is not inputted, the control signal generator circuit 11 outputs the word line pulse signal WLP, the writing pulse signal WP and the sense amplifier pulse signal SAP, the timing and pulse width of each of which has been internally set. When the switching control signal PCS is inputted, a part of the control signal generator circuit 11 is deactivated to generate the writing pulse signal WP and the sense amplifier pulse signal SAP, the timing of each of which is set on the basis of the writing control signal WPC and the sense amplifier pulse control signal SAPC which are supplied from the outside. The timing and pulse width of the word line pulse signal WLP can be controlled by adjusting the time of the clock signal CLK=H without supplying any control signals.

In this preferred embodiment, as shown in FIG. 2, in order to take out each of the internal control signals, which are generated from the control signal generator circuit 11, to the outside to monitor the signal, there are provided monitoring output buffers 12a, 12b and 12c for outputting the respective internal control signals to the outside, and monitor output terminals 13a, 13b and 13c corresponding thereto. In order to switch the operation mode between a usual data reading/writing operation mode and an operation mode for monitoring the internal control signal using the monitor terminals 13a, 13b and 13c, a PM internal terminal 14 for inputting a monitor control signal PM and an input buffer 15 are provided. The monitor control signal PM is designed to activate the monitoring output buffers 12a, 12b and 12c in the monitor operation mode.

Although all of the monitor output terminals 13a, 13b and 13c may be terminals for monitor use only, a part thereof is shared by other terminals in this preferred embodiment.

Specifically, the writing pulse signal monitor terminal 13b is not an exclusive terminal, and uses the data output terminal DOUT. Therefore, an AND gate G3 for deriving a conjunction of the output buffer control signal OBC and the monitor control signal PM is provided, and the monitoring output buffer 12b is activated by the output of the AND gate G3.

In addition, the output of the output buffer 12b is also inputted to the output buffer 7, which is connected to the data output terminal DOUT shown in FIG. 1, as a signal for controlling the activation and deactivation of the output buffer 7. Thus, the data output terminal DOUT is shared so that the read data output in the usual operation mode does not collide with the monitor output in the test operation.

An external address Add inputted from an address input terminal 24 is incorporated into an address buffer/register 25 by a clock signal CLK. Of the incorporated address Add, the row address RA is supplied to the row decoder 2, and the column address CA is supplied to the column decoder 4. A chip enable signal /CE and a write enable signal /WE, which are given to input terminals 26 and 28, are incorporated into a buffer/register 27 and a buffer/resister 29, respectively, by a clock signal CLK to be fed to a command decoder 32. An output enable signal /OE inputted from an input terminal 30 is supplied to the command decoder 32 via a buffer 31.

The command decoder 32 generates a writing circuit control signal WCC, a sense amplifier control signal SAC and an output buffer control signal OBC by the logical synthesis of the supplied signals. Specifically, the writing circuit control signal WCC is active (="H") in the data writing operation wherein /CE=/WE="L". The sense amplifier control signal SAC is active (="H") in the data reading operation wherein /CE="L" and /WE="H". The output buffer control signal OBC is active (="H") in the data reading operation wherein /CE=/OE="L" and /WE="H". When these control signals are in "L", the writing circuit 8, the sense amplifier circuit 6 and the output buffer 7 are held in an inactive state.

Figure 3:
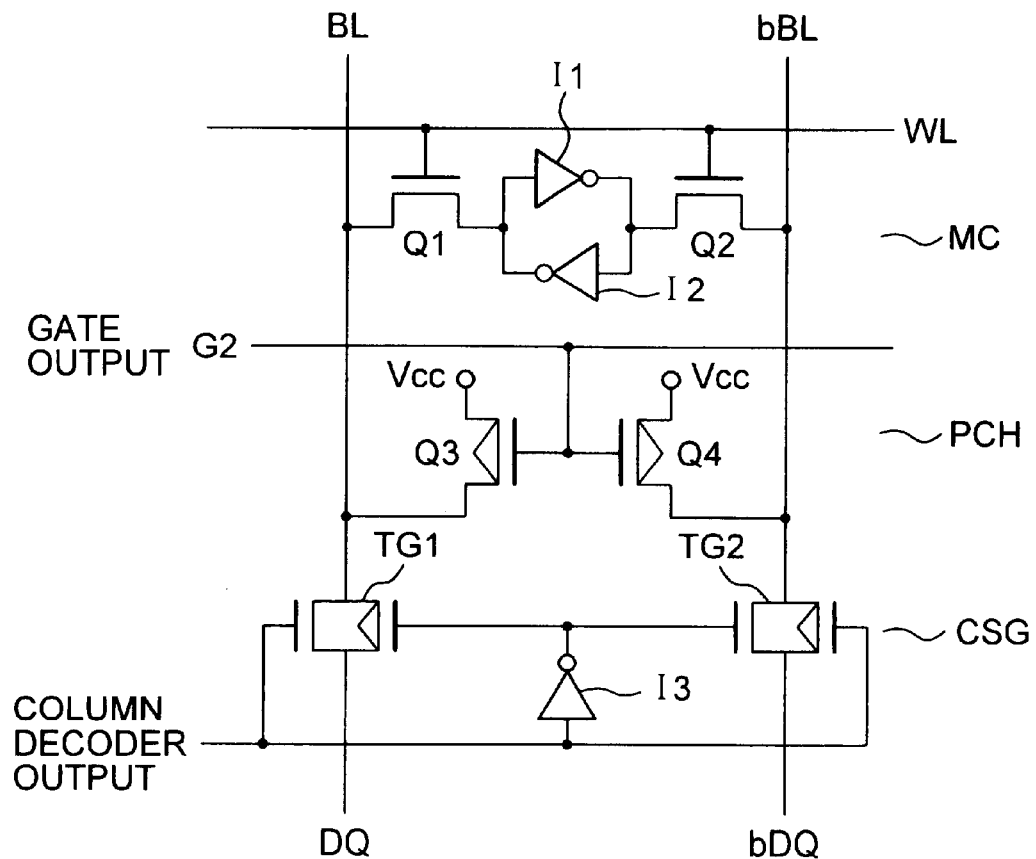
FIG. 3 is a circuit diagram showing the constructions of a memory cell, a bit line pre-charging circuit and a column gate in the preferred embodiment.

FIG. 3 shows the detailed constructions of the memory cell MC, the bit line pre-charging circuit PCH and the column gate CSG. The memory cell MC comprises a latch comprising inverters I1 and I2 connected inversely in parallel, and selecting transistors Q1 and Q2 for selectively connecting the node to the pair of bit lines BL and bBL. The bit line pre-charging circuit PCH comprises transistors Q3 and Q4 which are turned on by the output of the gate G2 to charge the pair of bit lines BL and bBL by means of a power supply VCC. The column gate CSC comprises CMOS transfer gates TG1 and TG2 which are turned on by the output of the column decoder.

Figure 4:
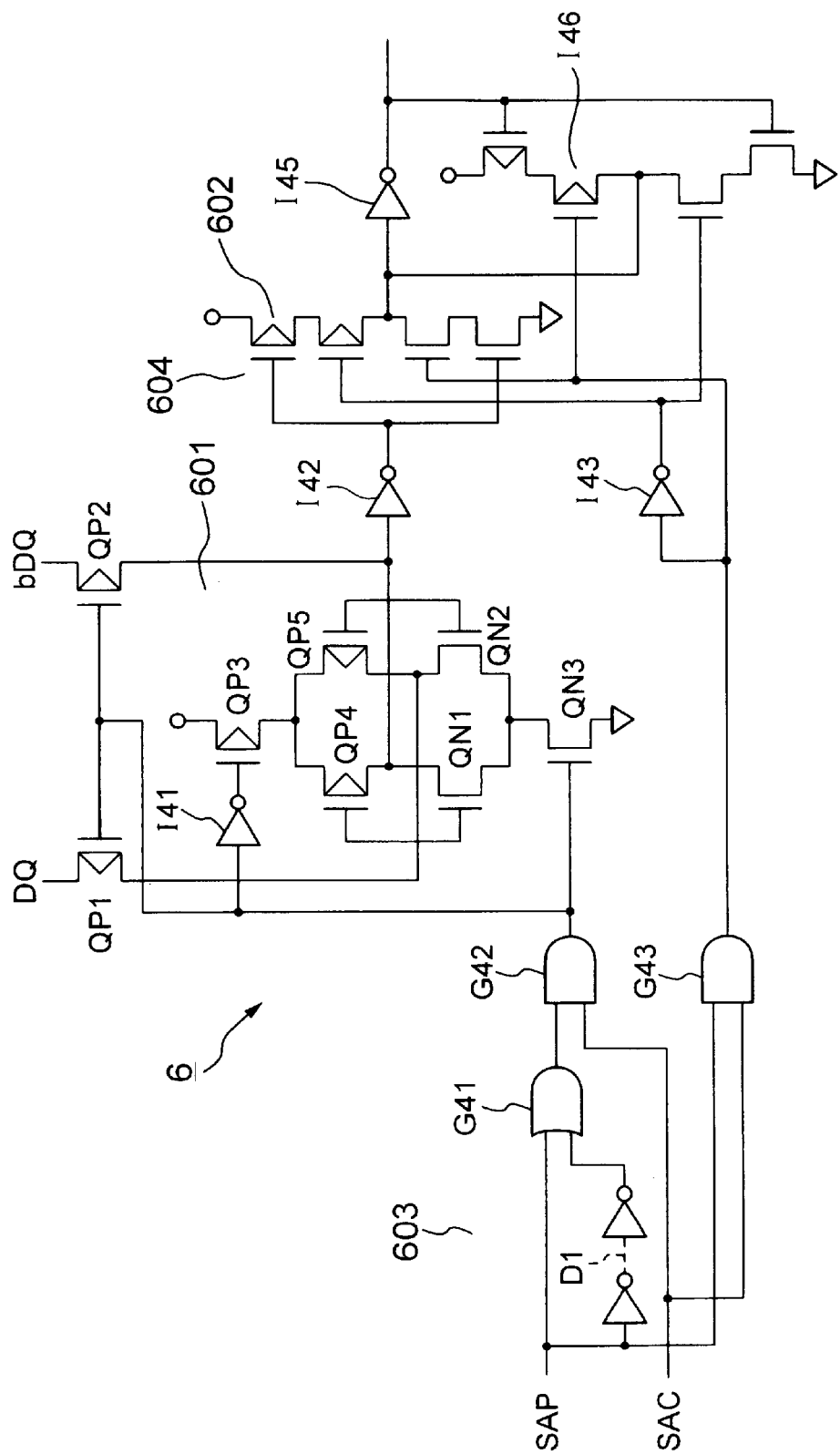
FIG. 4 is a circuit diagram showing the construction of a sense amplifier circuit in the preferred embodiment.

FIG. 4 shows the construction of the sense amplifier circuit 6. The sense amplifier circuit 6 includes a flip-flop type sense amplifier body 601 having nodes which are connected to the pair of data lines DQ and bDQ via transfer gates QP1 and QP2, respectively, and a latch circuit 602 comprising inverters 145 and 146, which are connected inversely in parallel, for holding read data from the sense amplifier body 601. The sense amplifier circuit 6 also includes an activating control circuit 603 in order to control activating transistors QP3 and QN3 of the sense amplifier body 601.

The activating control circuit 603 mainly comprises an AND gate G42 for deriving a conjunction of a sense amplifier pulse signal SAP, which is generated in each of clock cycles in synchronism with a clock signal CLK, and a sense amplifier control signal SAC which is generated in a data reading cycle. The sense amplifier pulse signal SAP is fed to the AND gate G42 after its pulse width is widened by the delay time of a delay circuit D1, which comprises even stages of inverter chains, by means of an OR gate G41 and the delay circuit D1. Thus, the sense amplifier body 601 is activated by a period of time, which corresponds to the enlarged pulse width of the sense amplifier pulse signal SAP, in a data reading cycle wherein the sense amplifier control signal SAC is in "H".

The activating control circuit 603 has an AND gate G43 for deriving a conjunction of a sense amplifier pulse signal SAP and a sense amplifier control signal SAC. In addition, a clocked inverter 604 controlled by the output of the AND gate G43 is provided between the sense amplifier body 601 and the data latch 602. That is, data read out by the sense amplifier body 601 are transferred to the latch circuit 602 via an inverter I42 and the clocked inverter 604. The delay circuit D1 of the activating control circuit 603 is designed to control the activating time of the sense amplifier body 601 so that the sense amplifier body 601 is deactivated after the clocked inverter 604 is turned off.

Figure 5:
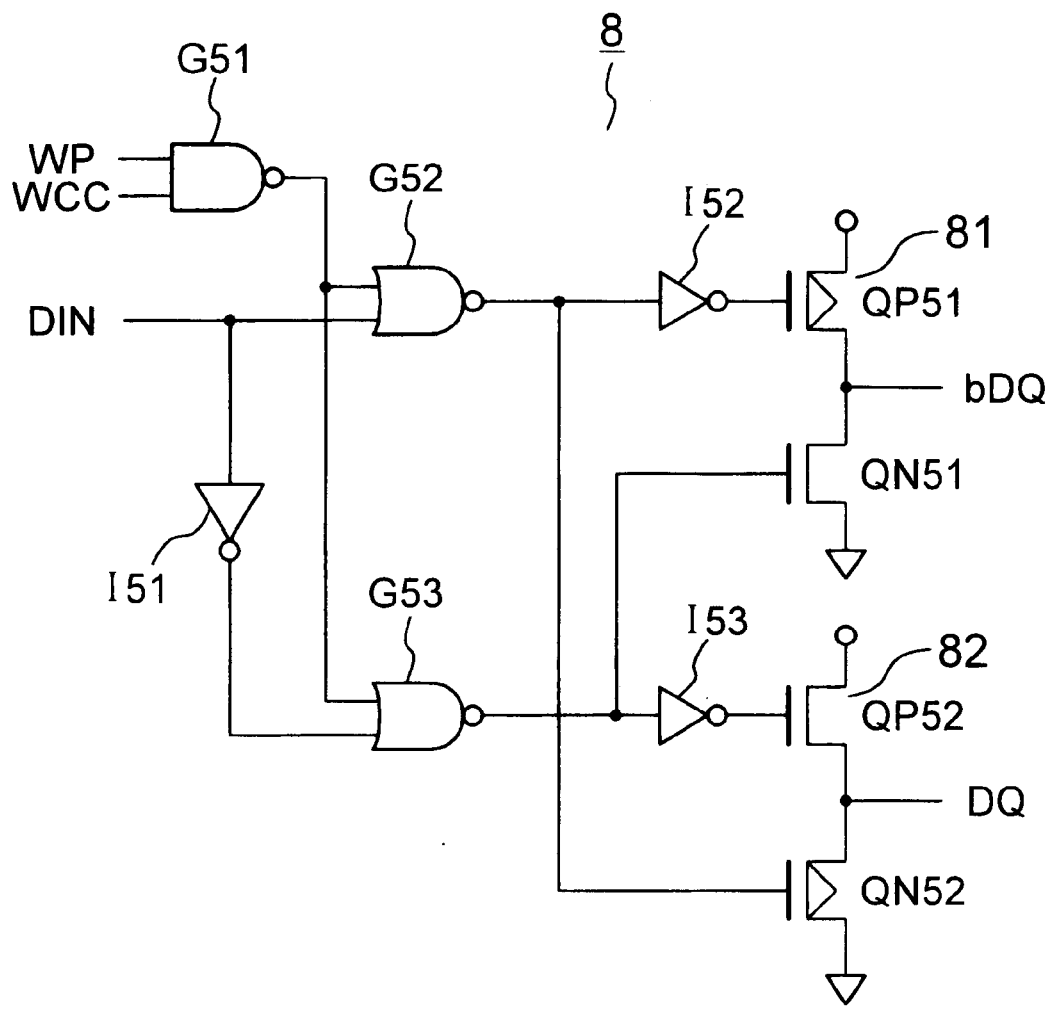
FIG. 5 is a circuit diagram showing the construction of a writing circuit in the preferred embodiment.

FIG. 5 shows the construction of the wring circuit 8. The writing circuit 8 has output circuits 81 and 82 for supplying complementary data to the pair of data lines DQ and bDQ. In order to complementarily control the output circuits 81 and 82 on the basis of data of the data input terminal DIN, the writing circuit 8 has inverters I51 through I52 and NOR gates G52 and G53.

A NAND gate G51 is designed to detect the coincidence of a writing pulse WP, which is generated in each of clock cycles in synchronism with a clock signal, with a writing circuit control signal WCC which is generated only in a cycle in a data writing operation mode. When the output of the NAND gate G51 is in "L", one of the outputs of the NOR gate G52 is in "H", and the other is in "L", in accordance with written data. Thus, complementary signals are given to the pair of data lines DQ and bDQ by the output circuits 81 and 82.

Figure 6:
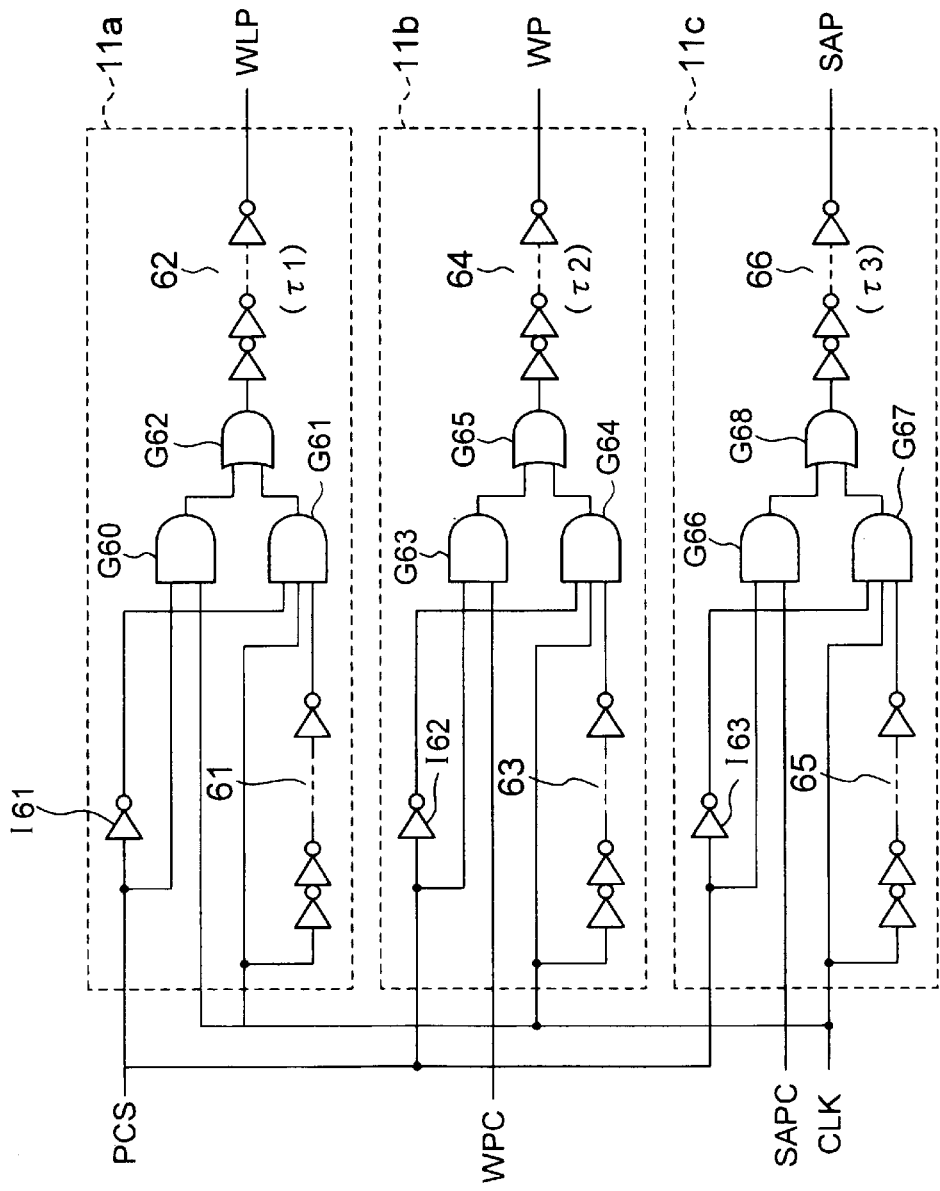
FIG. 6 is a circuit diagram showing the construction of a control signal generator circuit in the preferred embodiment.

FIG. 6 shows the detailed construction of the control signal generator circuit 11. As described above, the switching control signal PCS is designed to control the activation and deactivation of a part of the control signal generator circuit 11 to control whether the word line pulse signal WLP, the writing pulse signal WP and the sense amplifier pulse signal SAP are generated at a preset pulse width and timing (the usual operation mode) or the pulse width and timing are switched by an external control signal (the test operation mode). In the usual operation mode, the switching control signal PCS="L". At this time, in the WLP generator circuit 11a, the WP generator circuit 11b and the SAP generator circuit 11c, AND gates G60, G63 and G66 are held to be inactive, and AND gates G61, G64 and G67 are held to be active.

In the usual operation mode, in the WLP generator circuit 11a, the AND gate G61 derives the product of a clock signal CLK and a signal delayed from the clock signal CLK by a delay circuit 61 comprising odd stages of inverter chains, and the output of the AND gate G61 is taken out as a word line pulse signal WLP via an OR gate G62 and a delay circuit 62 comprising even stages of inverter chains. The delay circuit 61 is designed to determine the pulse width of the word line pulse signal WLP, and the delay time τ1 of the delay circuit 62 is designed to determine the timing from the rising of the clock signal of the word line pulse signal WLP.

The operation of the generation of the writing pulse signal WP by the WP generator circuit 11b in the usual operation mode is the same. That is, the AND gate G64 derives the product of a clock signal CLK and a signal delayed from the clock signal by a delay circuit 63 comprising odd stages of inverter chains, and the output of the AND gate G64 is taken out as a writing pulse signal WP via an OR gate G65 and a delay circuit 64 comprising even stages of inverter chains. The delay circuit 63 is designed to determine the pulse width of the writing pulse signal WP, and the delay time τ2 of the delay circuit 64 is designed to determine the timing from the rising of the clock signal of the writing pulse signal WP.

The operation of the generation of the sense amplifier pulse signal SAP by the SAP generator circuit 11c in the usual operation mode is the same. The AND gate G67 derives the product of a clock signal CLK and a signal delayed from the clock signal by a delay circuit 65 comprising odd stages of inverter chains, and the output of the AND gate G67 is taken out as a sense amplifier pulse signal SAP via an OR gate G68 and a delay circuit 66 comprising even stages of inverter chains. The delay circuit 65 is designed to determine the pulse width of the sense amplifier pulse signal SAP, and the delay time τ3 of the delay circuit 66 is designed to determine the timing from the rising of the clock signal of the sense amplifier pulse signal SAP.

In the test mode wherein PCS="H", the WLP generator circuit 11a, the WP generator circuit 11B and the SAP generator circuit 11c hold the AND gates G60, G63 and G66 to be active, and the AND gates G61, G64 and G67 to be inactive, respectively. At this time, in the WLP generator circuit 11a, the clocks signal CLK passes through the AND gate G60 and the OR gate G62 to pass through the delay circuit 62 to be outputted as the word line pulse signal WLP. That is, the WLP generator circuit 11a utilizes the clock signal CLK itself as the word line signal WLP without using any external control signals. The pulse width of the clock signal CLK and the delay time caused by the delay circuit 62 are designed to determine the pulse width and timing of the word line pulse signal WLP.

On the other hand, in the WP generator circuit 11b, the writing pulse control signal WPC, which is an external control signal, enters the AND gate G63 which has been activated by PCS="H". Then, the output of the AND gate G63 is outputted as a writing pulse signal WP via the OR gate G65 and the delay circuit 64. That is, at this time, the pulse width of the writing pulse signal WP is determined by controlling the pulse width of the writing pulse control signal WPC which is supplied from the outside. The timing in generating the writing pulse signal WP is determined by the sum of the delay time τ2 caused by the delay circuit 64, and the delay time of the supplied control signal WPC from the clock signal CLK.

Similarly, also in the SAP generator circuit 11c, the sense amplifier pulse control signal SAPC, which is an external control signal, enters the AND gate G66 which has been activated by PCS="H". Then, the output of the AND gate G66 is outputted as a sense amplifier pulse signal SAP via the OR gate G68 and the delay circuit 66. At this time, the pulse width of the sense amplifier pulse signal SAP is determined by controlling the pulse width of the sense amplifier pulse control signal SAP which is supplied from the outside. The timing in generating the sense amplifier pulse signal SAP is determined by the sum of the delay time τ3, which is caused by the delay circuit 66, and the delay time of the supplied control signal SAPC, from the clock signal CLK.

Figure 7A:
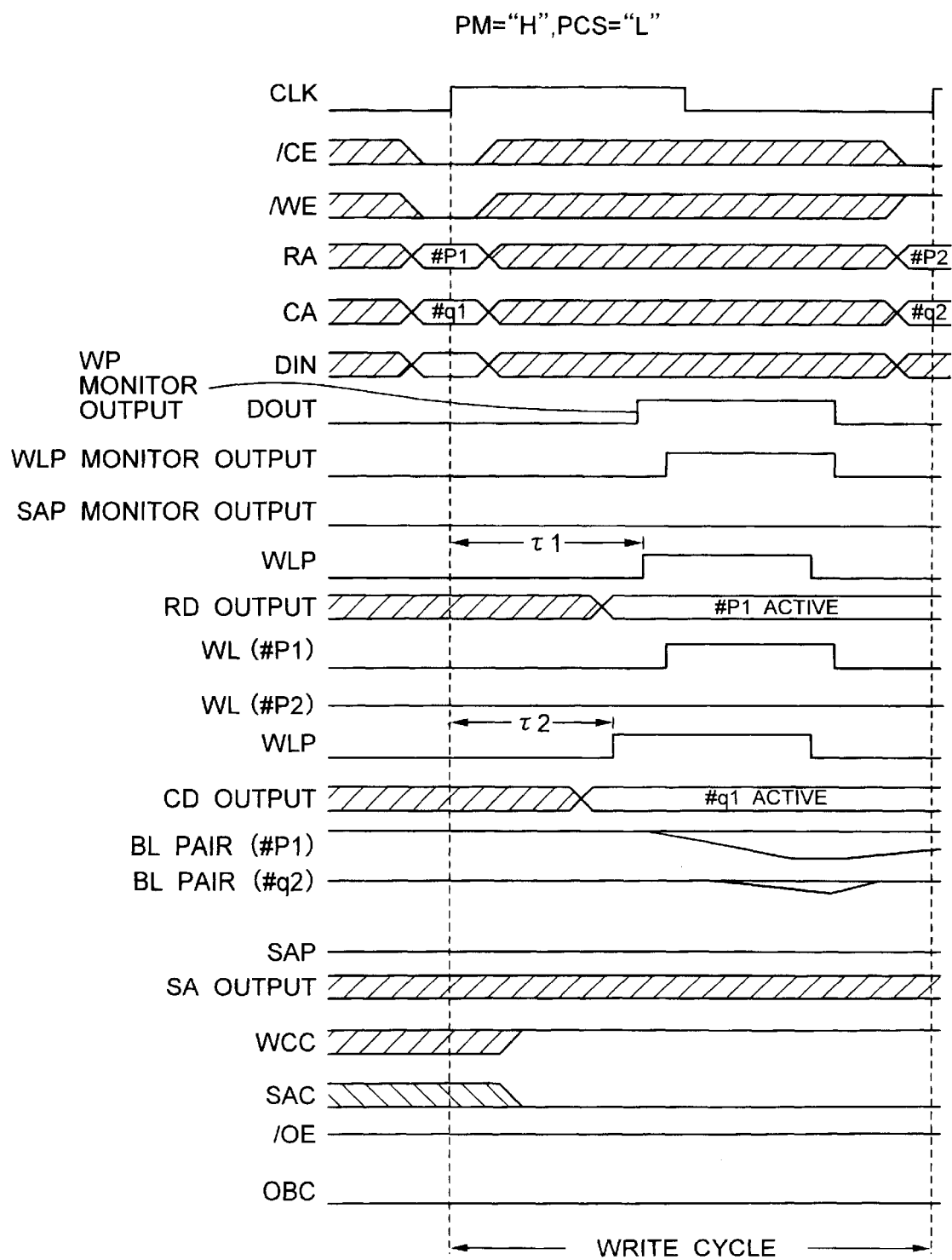
FIG. 7A is a timing chart for explaining the monitor operation of an internal control signal in the preferred embodiment.
Figure 7B:
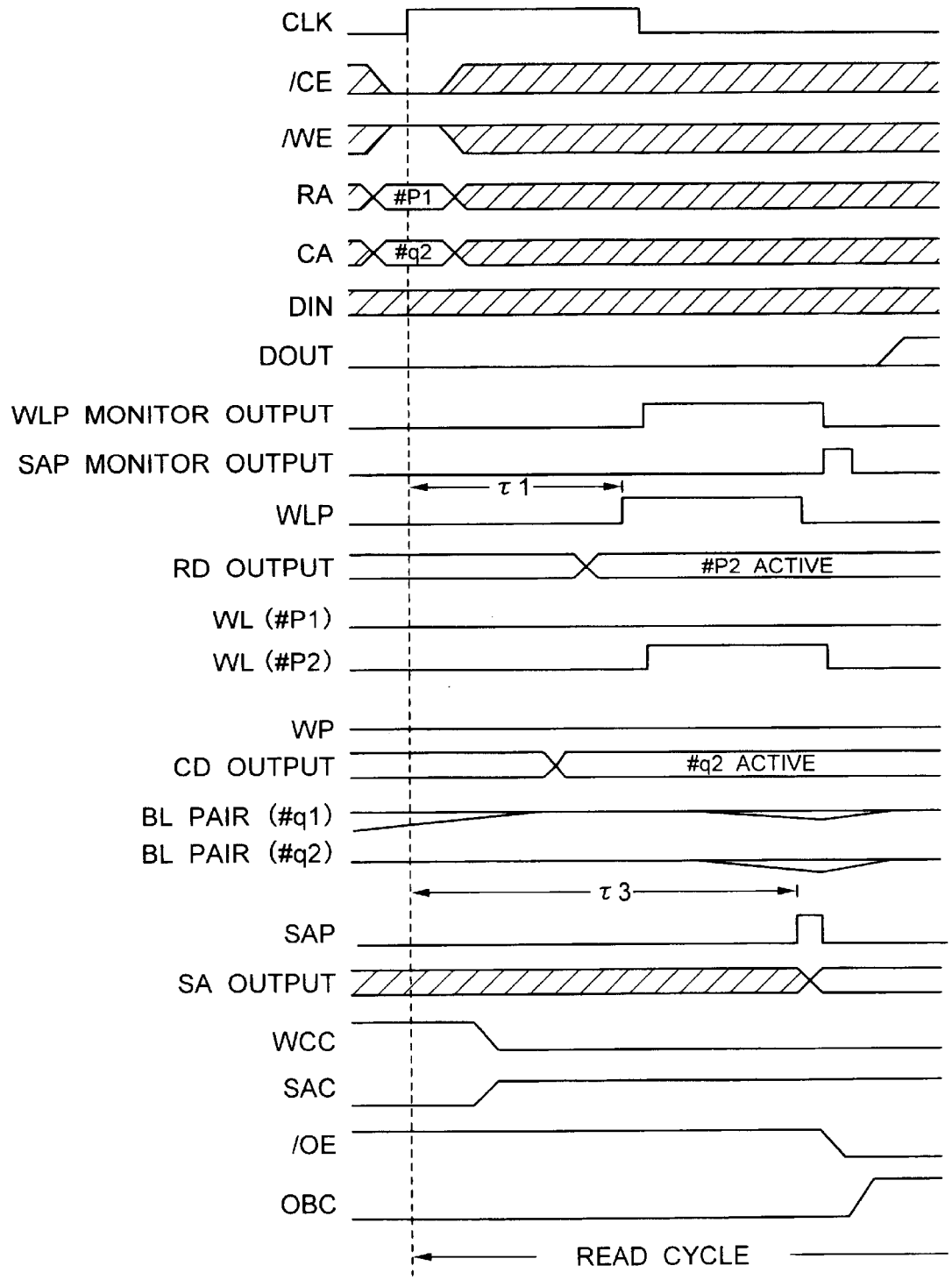
FIG. 7B is a timing chart for explaining the monitor operation of an internal control signal in the preferred embodiment.

The usual data reading/writing operation of the clock synchronous SRAM with the above described construction is the same as the conventional operation. In this usual operation, as described above, the monitor control signal PM is in "L", and the switching control signal PCS is in "L". Then, when the internal control signal monitoring operation is carried out, the monitor control signal PM is set to be in "H" while PCS="L", and the address input and data input are carried out. Specifically, when a read cycle subsequent to a write cycle is executed, the operation waveforms are shown in FIGS. 7A and 7B. FIGS. 7A and 7B show continuous cycles wherein periods of time are partially overlapped with each other.

In the write cycle, a data write operation having inputted an address #P1 as a row address and an address #qi as a column address CA is shown. At this time, the word line pulse signal WLP is generated at time τ1 (the delay time in the delay circuit 62 of FIG. 6) from the leading edge of the clock signal CLK, and the writing pulse signal WP is generated at time τ2 (the delay time in the delay circuit 64 of FIG. 6) from the leading edge of the clock signal CLK. The writing circuit 8 is activated by AND of the writing pulse signal WP and the writing circuit control signal WCC.

In FIG. 7A, after the row decoder (RD) output is activated, the word line pulse signal WLP is activated, and after the column decoder (CD) output is activated, the writing pulse signal WP is activated. Thus, a normal data writing operation is carried out, and written data are transferred to a corresponding pair of bit lines BL and bBL of the column address #q1.

Then, in this preferred embodiment, in accordance with these pulse signals, the WLP monitor output is outputted to the monitor terminal 13a of FIG. 2, and the WP monitor output is outputted to the monitor terminal 13b of FIG. 2 (i.e., the data output terminal DOUT which is a shared terminal).

In the read cycle subsequent to the write cycle, as shown in FIG. 7B, a data read operation having inputted an address #P2 as a row address RA and an address #q2 as a column address CA is shown. Also at this time, the word line pulse signal WLP is generated at time τ1 (the delay time in the delay circuit 62 of FIG. 6) from the leading edge of the clock signal CLK. In addition, the sense amplifier pulse signal SAP is generated at time τ3 (the delay time in the delay circuit 66 of FIG. 6) from the leading edge of the clock signal CLK. In accordance with these control signals, the WLP monitor output is given to the monitor terminal 13a, and the SAP monitor output is given to the monitor terminal 13C.

As described above, by carrying out the data writing/reading operation on the conditions that the monitor control signal PM="H" and the switching control signal PCS="L", it is possible to monitor the word line pulse signal WLP, the writing pulse signal WP and the sense amplifier pulse signal SAP, which are internal control signals. Thus, the estimation and certification of the optimum internal control signals can be carried out by comparing the timings and pulse widths.

Figure 8A:
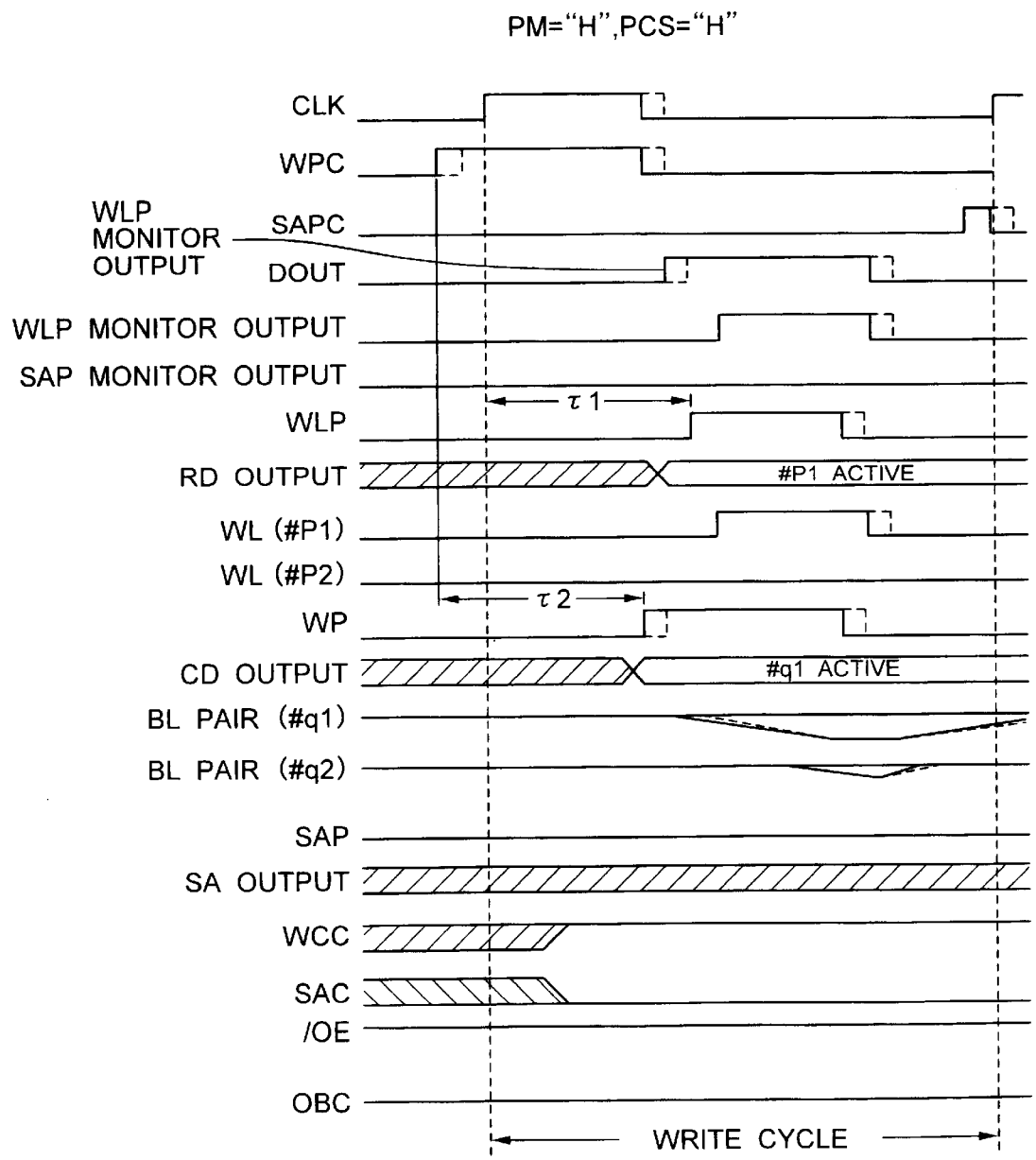
FIG. 8A is a timing chart for explaining the test operation of an internal control signal by a switching control in the preferred embodiment.
Figure 8B:
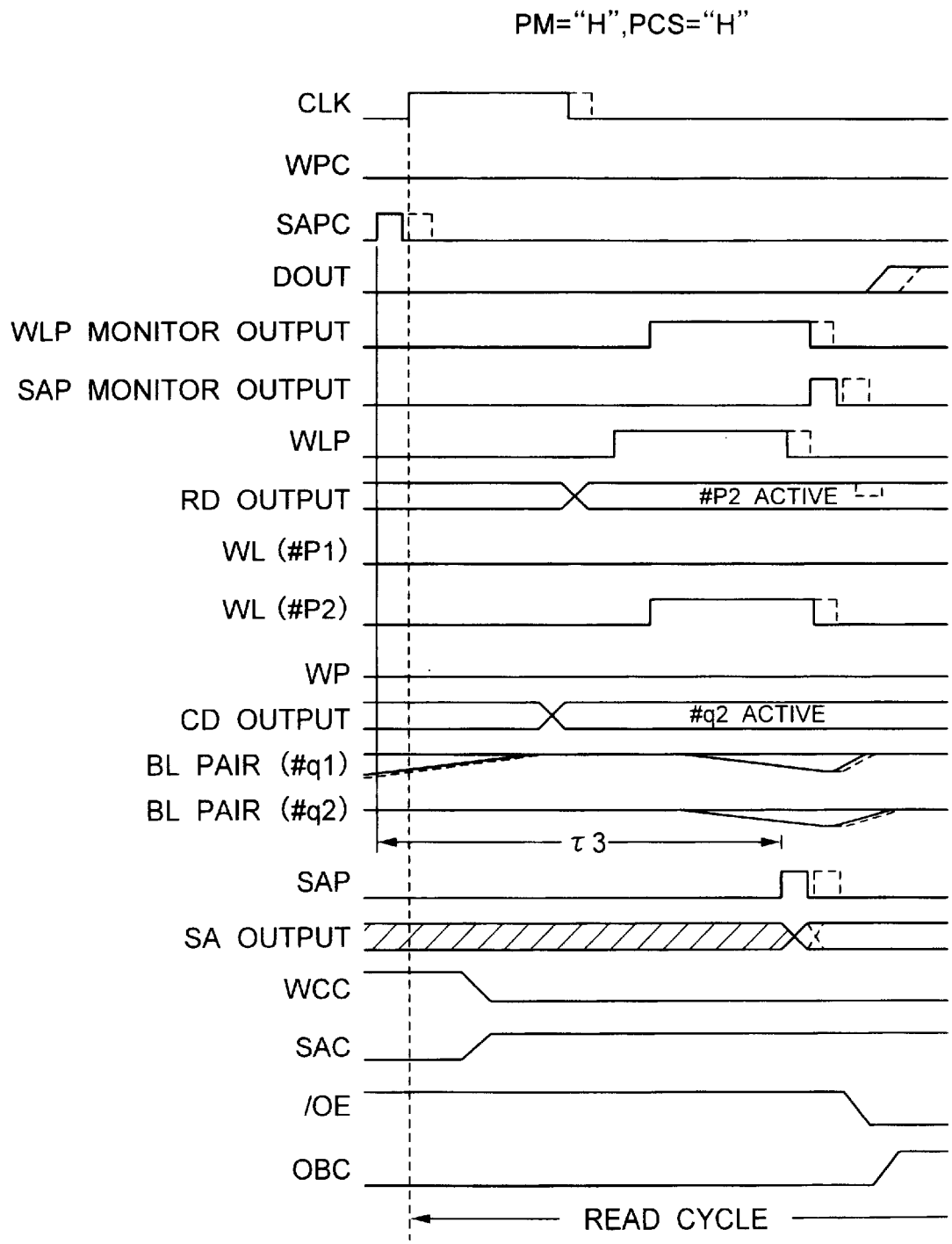
FIG. 8B is a timing chart for explaining the test operation of an internal control signal by a switching control in the preferred embodiment.

FIGS. 8A and 8B show operation timings when internal control signals are switched by external control signals to carry out a test operation on the conditions that the monitor control signal PM="H" and the switching control signal PCS="H". Also in this case, FIG. 8A shows a write cycle, FIG. 8B shows a subsequent read cycle, and the periods of time of both are partially overlapped with each other. Since the chip enable signal /CE, the write enable signal /WE, the address ADD input and the data input DIN are the same as those in FIGS. 7A and 7B, these are omitted from the figures.

In this test operation mode, as shown in FIG. 8A, the word line pulse signal WLP is generated at time τ1 from the leading edge of the clock signal CLK so as to have a pulse width determined by the pulse width of the clock signal CLK. As described referring to FIG. 6, although no external control signal is used for the word line pulse signal WLP, the pulse width of the word line pulse signal WLP can be set by changing the width of the clock signal CLK as shown by the broken and solid line in FIG. 8A. Then, with respect to this word line pulse signal WLP, the WLP monitor output is obtained from the monitor terminal 13a.

The pulse width of the writing pulse signal WP is determined by the pulse width of the writing pulse control signal WPC by supplying the writing pulse control signal WPC which is an external control signal. In addition, as shown in FIG. 8A, the timing in generating the writing pulse signal WP is time τ2 from the leading edge of the writing pulse control signal WPC. As shown by the broken and solid lines, the relationship between the timings of the row decoder RD output and column decoder CD output of the writing pulse signal WP can be set by the timing in supplying the writing pulse control signal WPC from the outside. Similar to FIG. 7A, the monitor output of the writing pulse signal WP is obtained from the read data output terminal DOUT.

The pulse width of the sense amplifier pulse signal SAP is also determined by the pulse width of the sense amplifier pulse control signal SAPC by supplying the sense amplifier pulse control signal which is an external control signal. In addition, as shown in FIG. 8B, the timing in generating the sense amplifier pulse signal SAP is time τ3 from the leading edge of the control signal SAPC. As shown by the broken and solid lines, the relationship between the timings of the sense amplifier pulse signal SAP and the decoder output can be set by the timing in supplying the sense amplifier pulse control signal SAPC from the outside. Similar to FIG. 7B, the monitor output of the sense amplifier pulse signal SAP is obtained from the dedicated monitor terminal 13c. In the second half of the read cycle, the output buffer control signal OBC is in "H", and the read data is taken out of the output terminal DOUT. At this time, the monitoring output buffer 12b of FIG. 2 is deactivated by the output buffer control signal OBC="H", so that the collision of the monitor output with the read data output is avoided.

If the test operation mode is executed as described above, it is possible to carry out the operation test wherein the timings and pulse widths of the internal control signals are adjusted, so that it is possible to certify the optimum conditions. Specifically, it is possible to certify the optimum conditions of the activation of the sense amplifier circuit for carrying out a high speed data reading operation, the optimum conditions of the activation of the writing circuit for carrying out a high speed data writing operation, and the optimum conditions of the activation of the word line for reducing the memory cell current.

Furthermore, while the monitor control signal has been fixed to be PM="H" to carry out the write and read cycles in the descriptions of the operations in FIGS. 8A and 8B, it may be fixed to be PM="L" after the relationship between the timings of the internal control signals is verified. In this case, only the read data from the memory cell array are outputted to the reading data terminal DOUT. Therefore, when the write cycle is switched to the read cycle, it is possible to prevent the bad influence on the subsequent read data due to the occurrence of the WP monitor in the data output terminal DOUT shared as the monitor output terminal of the wiring pulse signal WP.

Figure 9:
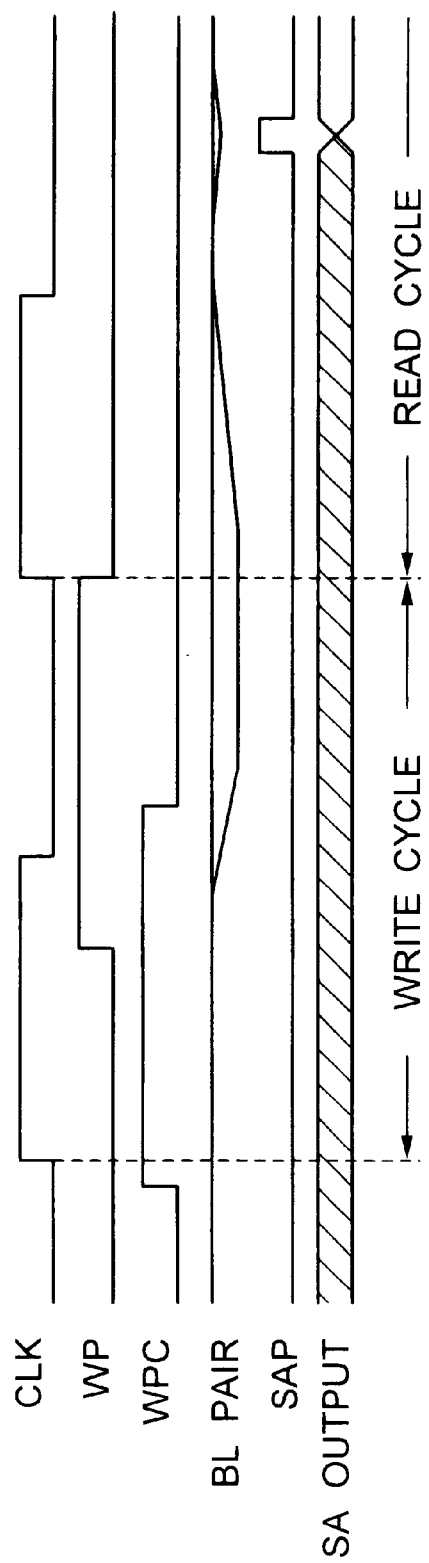
FIG. 9 is a timing chart for explaining the test operation of an internal control signal by a switching control in the preferred embodiment.
Figure 10:
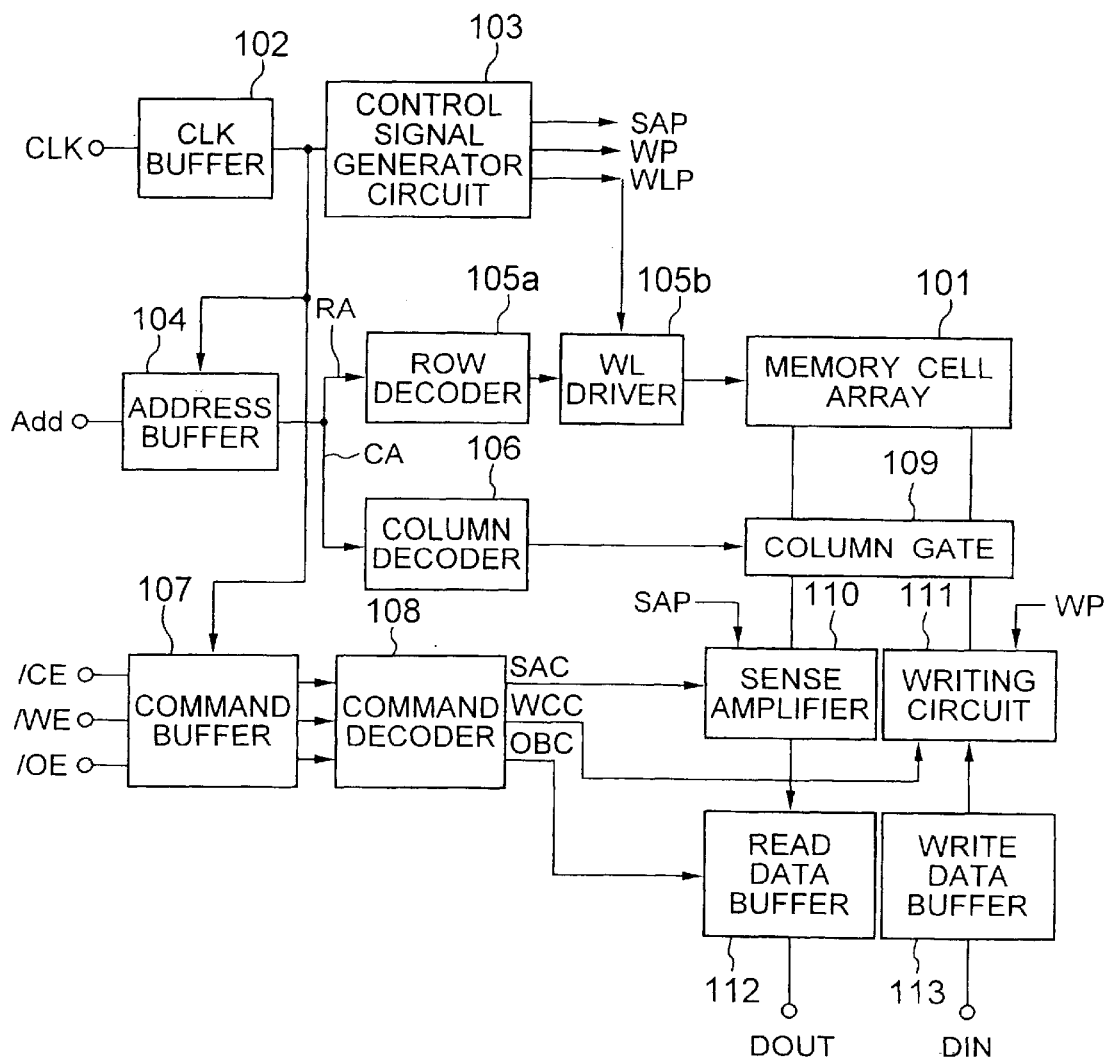
FIG. 10 is a block diagram showing the construction of a conventional SRAM.
Figure 11A:
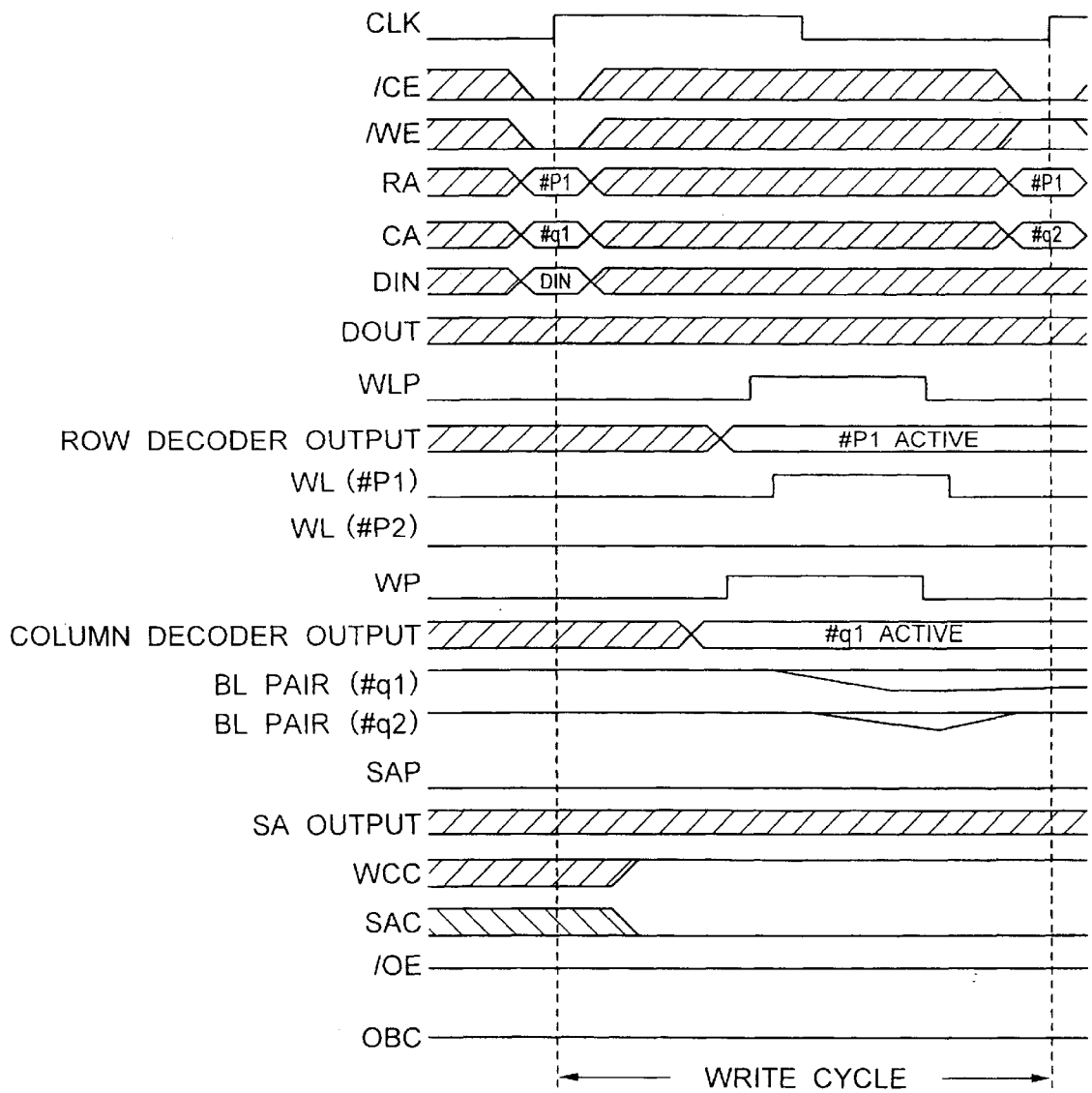
FIG. 11A is a timing chart for explaining the operation of the conventional SRAM.
Figure 11B:
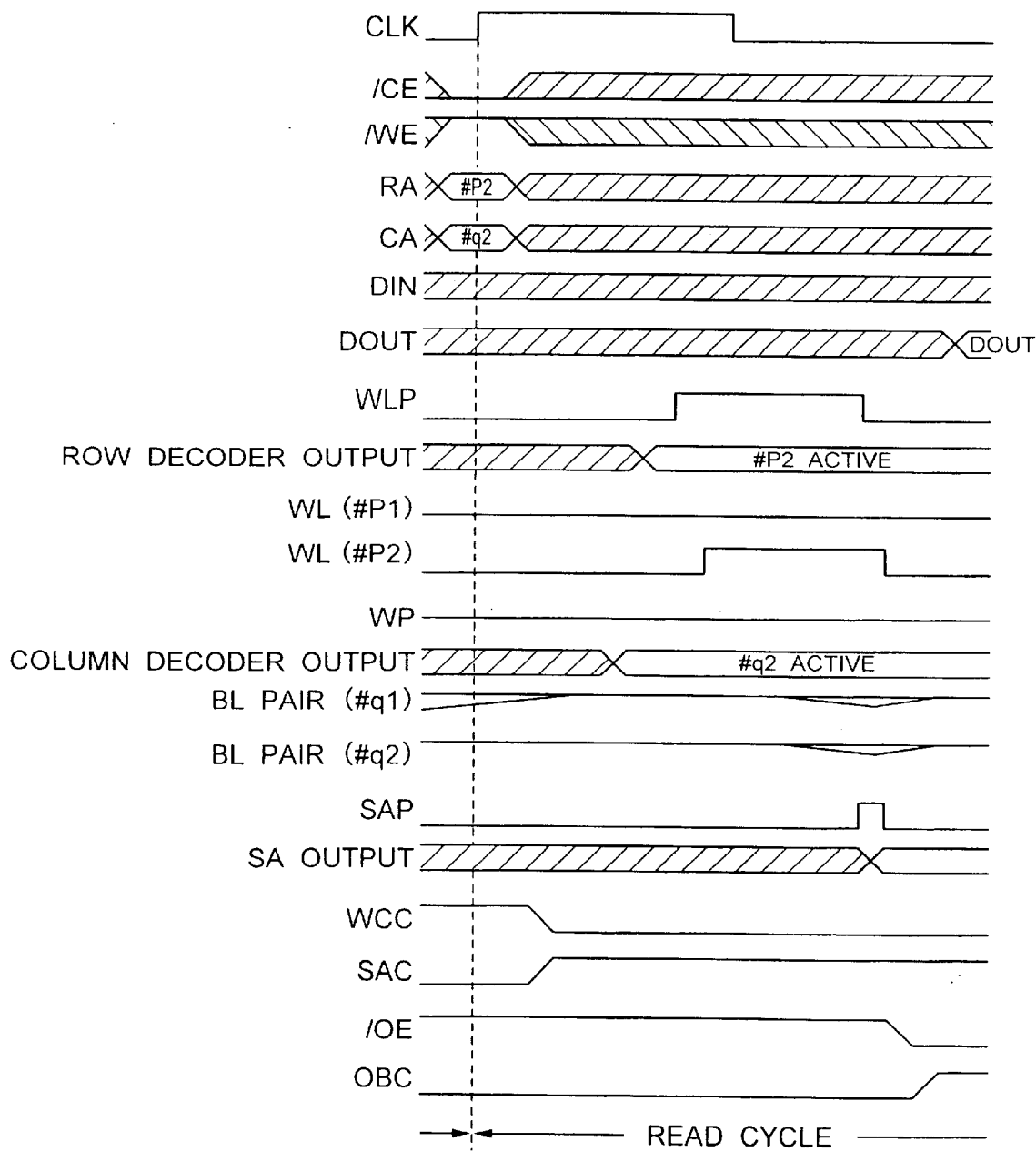
FIG. 11B is a timing chart for explaining the operation of the conventional SRAM.
Figure 12A:
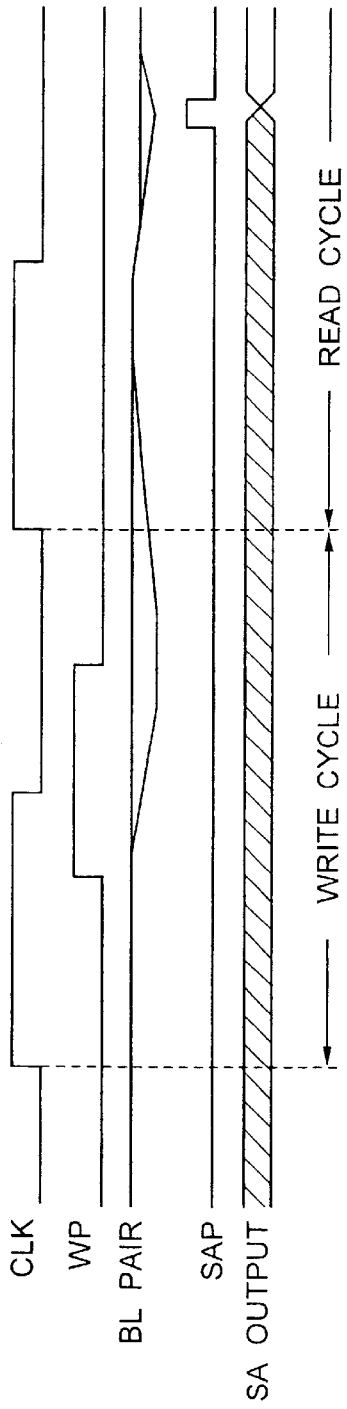
FIGS. 12A and 12B are timing charts for explaining the influence of the operating speed of the conventional SRAM.
Figure 12B:
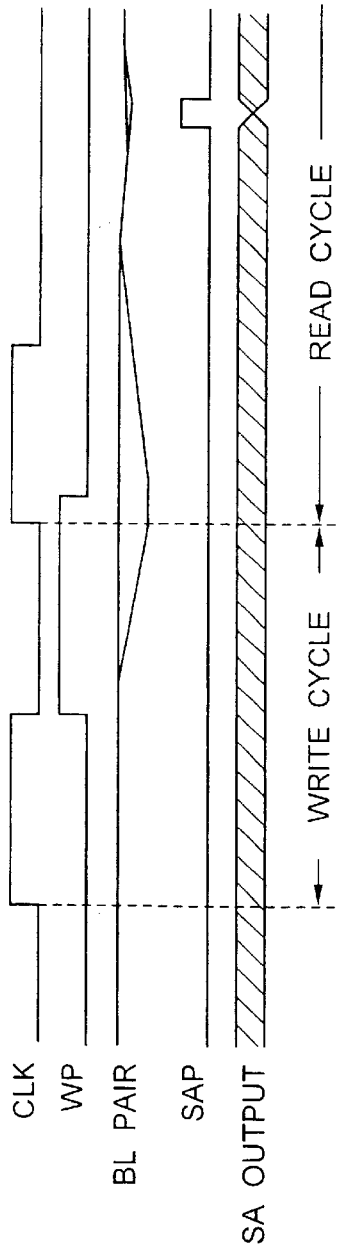

An example where the same operation waveform as that at a high frequency clock described referring to FIG. 12B is realized at a low frequency clock in the above described test operation mode will be described below. This operation waveform is shown in FIG. 9. Basically, similar to FIGS. 8A and 8B, this sets the switching signal PCS="H" to control the internal pulse control signal from the outside. At this time, by extending the pulse width of the writing pulse signal WP, the influence of the written data in the write cycle on the next read cycle is evaluated. Although the frequency of the clock signal CLK is low, the influence of the written data in the write cycle on the bit line in the read cycle appears, and the operation waveform is equivalent to that in FIG. 12B.

If the memory characteristic are evaluated on such conditions using an inexpensive tester having a low operating frequency, it is possible to carry out a characteristic estimation which is equivalent to the characteristic estimation carried out using a high speed tester by enhancing the operating frequency.

The present invention should not be limited to the above described preferred embodiments. For example, while the monitoring and external control for three signals of the word line pulse signal WLP, the writing pulse signal WP and the sense amplifier pulse signal SAP as internal control signals have been described in the above described preferred embodiments, there is a sense in carrying out even the monitoring and external control of one of these signals.

In addition, while the delay circuit for determining the timing from the clock edge of the internal control pulse has been used directly as the delay circuit for determining the timing from the external control signal edge in the case of the external control in the above described preferred embodiments, these delay circuits may be separately provided.

Moreover, while it has been possible to carry out the monitoring and variable control from the outside of the internal control signals in the above described preferred embodiments, there is a sufficient effect on the characteristic estimation of the memory even if it is possible to carry out only the monitoring or the variable control from the outside.

In addition, while the timing and pulse width of the word line pulse signal WLP have been controlled by utilizing the clock signal from the clock signal terminal without providing any external control signal terminals for the word line pulse signal WLP in the above described preferred embodiments, a special external control signal terminal may be prepared similar to those for other control signals. Moreover, with respect to the writing pulse signal WP or the sense amplifier pulse signal SAP, not with respect to the word line pulse signal WLP, the clock signal may be utilized as an external control signal similar to that with respect to the word line pulse signal WLP in the above described preferred embodiments.

Moreover, while the SRAM has been described in the above described preferred embodiments, the present invention should not be limited thereto, but the invention may be applied to various clock synchronous semiconductor memory devices.

As described above, according to the present invention, by allowing the monitoring of the timing and pulse width of the internal control signals generated on the basis of the clock signal, it is possible to easily certify and estimate the internal circuit of the clock synchronous semiconductor memory device. In addition, according to the present invention, by allowing the timing and pulse width of the internal control signals to be switched and controlled from the outside, it is possible to optimize and estimate/certify various memory characteristics.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor memory device comprising:

a memory cell array;

a control signal generating circuit for generating at least first through third control signals on the basis of an edge of a clock signal, said control signals having adjustable predetermined active intervals;

a word line driving circuit for driving a word line of said memory cell array in synchronism with said first control signal which is generated from said control signal generating circuit;

a sense amplifier circuit for reading bit line data of said memory cell array in synchronism with said second control signal which is generated from said control signal generating circuit;

a writing circuit for writing data in said memory cell array in synchronism with said third control signal which is generated from said control signal generating circuit; and a monitor circuit for monitoring at least one of said first through third control signal, which are generated from said control signal generating circuit.

2. The semiconductor memory device as set forth in claim 1, wherein said monitoring circuit includes a terminal for externally monitoring.

3. The semiconductor memory device as set forth in claim 1, wherein timings for generating and terminating said first through third control signals are based on a rising or falling edge of the clock signal.

4. The semiconductor memory device as set forth in claim 1, wherein said timings for generating and terminating said control signals are controlled by an external control signal.

5. The semiconductor memory device as set forth in claim 1, which has a first operation mode for data reading/writing using said first through third control signals generated from said control signal generating circuit, and a second operation mode for activating said monitor circuit and outputting at least said first through third control signals.

6. The semiconductor memory device as set forth in claim 1, which has a third operation mode for supplying an external control signal from a control signal switching means in place of at least one of said first through third control signals, to read/write data.

7. The semiconductor memory device as set forth in claim 6, wherein said control signal switching means comprises a switching control signal input terminal for inputting a switching control signal for deactivating at least a part of said control signal generating circuit; and an external control signal input terminal for inputting said external control signal.

8. The semiconductor memory device as set forth in claim 1, wherein said monitor circuit comprises:

a monitor output terminal for outputting at least one of said first through third control signals which are generated from said control signal generating circuit;

a monitoring output buffer for outputting at least one of said first through third control signals, which are generated from said control signal generating circuit, to said monitor output terminal; and a monitor control input terminal for supplying a monitor control signal for activating said monitoring output buffer.

9. The semiconductor memory device as set forth in claim 8, wherein said monitor output terminal is provided as a dedicated terminal.

10. The semiconductor memory device as set forth in claim 8, wherein at least a part of said monitor output terminal is shared with another signal terminal.

11. The semiconductor memory device as set forth in claim 6, wherein with respect to at least one of said first through third control signals, a clock signal from a clock signal input terminal is able to be used as said external control signal without providing any external control signal input terminals.

12. A semiconductor memory device comprising:

a memory cell array;

a control signal generating circuit for generating at least first through third control signal on the basis of a clock signal, said control signals having adjustable predetermined active intervals;

a word line driving circuit for driving a word line of said memory cell array in synchronism with said first control signal which is generated from said control signal generating circuit;

a sense amplifier circuit for reading bit line data of said memory cell array in synchronism with said second control signal which is generated from said control signal generating circuit;

a writing circuit for writing data in said memory cell array in synchronism with said third control signal which is generated from said control signal generating circuit; and control signal switching circuit for generating a pulse signal based on an external control signal, from said control signal generating circuit in place of at least one of said first through third control signals which are generated from said control signal generating circuit.

13. The semiconductor memory device as set forth in claim 12, wherein timings for generating and terminating said first through third control signals generated internally are based on a rising or falling edge of the clock signal.

14. The semiconductor memory device as set forth in claim 12, wherein said timings for generating and terminating said control signals are controlled by said external control signal.

15. The semiconductor memory device as set forth in claim 12, which has a first operation mode for data reading/ writing using said first through third control signals generated from said control signal generating circuit, a second operation mode for activating a monitor means and outputting at least said first through third control signals, and a third operation mode for supplying the external control signal from the control signal switching circuit to read/write data.

16. The semiconductor memory device as set forth in claim 12, wherein said control signal switching circuit comprises a switching control signal input terminal for inputting a switching control signal for deactivating at least a part of said control signal generating circuit; and an external control signal input terminal for inputting said external control signal.

17. The semiconductor memory device as set forth in claim 12, wherein with respect to at least one of said first through third control signals, a clock signal from a clock signal input terminal is able to be used as said external control signal without providing any external control signal input terminals.

* * * * *